United States Patent
Chatterjee et al.

(10) Patent No.: US 8,309,957 B2
(45) Date of Patent: Nov. 13, 2012

(54) REPLACEMENT OF SCRIBELINE PADFRAME WITH SAW-FRIENDLY DESIGN

(75) Inventors: Basab Chatterjee, Allen, TX (US); Jeffrey Alan West, Dallas, TX (US); Gregory Boyd Shinn, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 416 days.

(21) Appl. No.: 12/759,005

(22) Filed: Apr. 13, 2010

(65) Prior Publication Data

US 2010/0264413 A1 Oct. 21, 2010

Related U.S. Application Data

(60) Provisional application No. 61/170,004, filed on Apr. 16, 2009.

(51) Int. Cl.
*H01L 23/50* (2006.01)

(52) U.S. Cl. .......... 257/48; 257/620; 257/698; 257/758; 257/773; 257/E23.079

(58) Field of Classification Search .................... 257/48, 257/620, 698, 75, 773, E23.079, E21.599, 257/E23.194

See application file for complete search history.

(56) References Cited

U.S. PATENT DOCUMENTS

| | | | | |
|---|---|---|---|---|
| 6,022,791 A * | 2/2000 | Cook et al. | | 438/458 |
| 6,492,247 B1 * | 12/2002 | Guthrie et al. | | 438/460 |
| 7,129,566 B2 * | 10/2006 | Uehling et al. | | 257/620 |
| 7,821,104 B2 * | 10/2010 | Lee et al. | | 257/620 |
| 2007/0290371 A1 * | 12/2007 | Chen | | 257/784 |
| 2008/0020559 A1 * | 1/2008 | Chen et al. | | 438/597 |
| 2010/0078769 A1 * | 4/2010 | West et al. | | 257/620 |
| 2010/0123135 A1 * | 5/2010 | Chen | | 257/48 |

* cited by examiner

*Primary Examiner* — Minh-Loan T Tran
*Assistant Examiner* — Fazli Erdem
(74) *Attorney, Agent, or Firm* — Jacqueline J. Garner; Wade J. Brady, III; Frederick J. Telecky, Jr.

(57) ABSTRACT

An integrated circuit substrate containing an electrical probe pad structure over, and on both sides of, a dicing kerf lane. The electrical probe pad structure includes metal crack arresting strips adjacent to the dicing kerf lane. A metal density between the crack arresting strips is less than 70 percent. An electrical probe pad structure containing metal crack arresting strips, with a metal density between the crack arresting strips less than 70 percent. A process of forming an integrated circuit by forming an electrical probe pad structure over a dicing kerf lane adjacent to the integrated circuit, such that the electrical probe pad structure has metal crack arresting strips adjacent to the dicing kerf lane, and performing a dicing operation through the electrical probe pad structure.

12 Claims, 3 Drawing Sheets

US 8,309,957 B2

REPLACEMENT OF SCRIBELINE PADFRAME WITH SAW-FRIENDLY DESIGN

FIELD OF THE INVENTION

This invention relates to the field of integrated circuits. More particularly, this invention relates to probe pads on integrated circuit substrates.

BACKGROUND OF THE INVENTION

Integrated circuit substrates, such as silicon wafers, may contain test structures between the integrated circuits. The test circuits may include electrical probe pads. Dicing operations such as sawing which separate the integrated circuits may cut through the electrical probe pads. Cracks may propagate in the substrate from diced edges of the substrate toward the integrated circuits.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An electrical probe pad structure may be formed across a dicing kerf lane on an integrated circuit substrate, with a metal density of the probe pad in the dicing kerf lane less than 70 percent. The probe pad includes metal crack arresting strips adjacent to, and outside of, the dicing kerf lane. Optional transverse metal shunts may be formed which electrically connect crack arresting strips on opposite sides of the dicing kerf lane. The probe pad may be formed of multiple interconnect levels.

DETAILED DESCRIPTION

Figure 1:
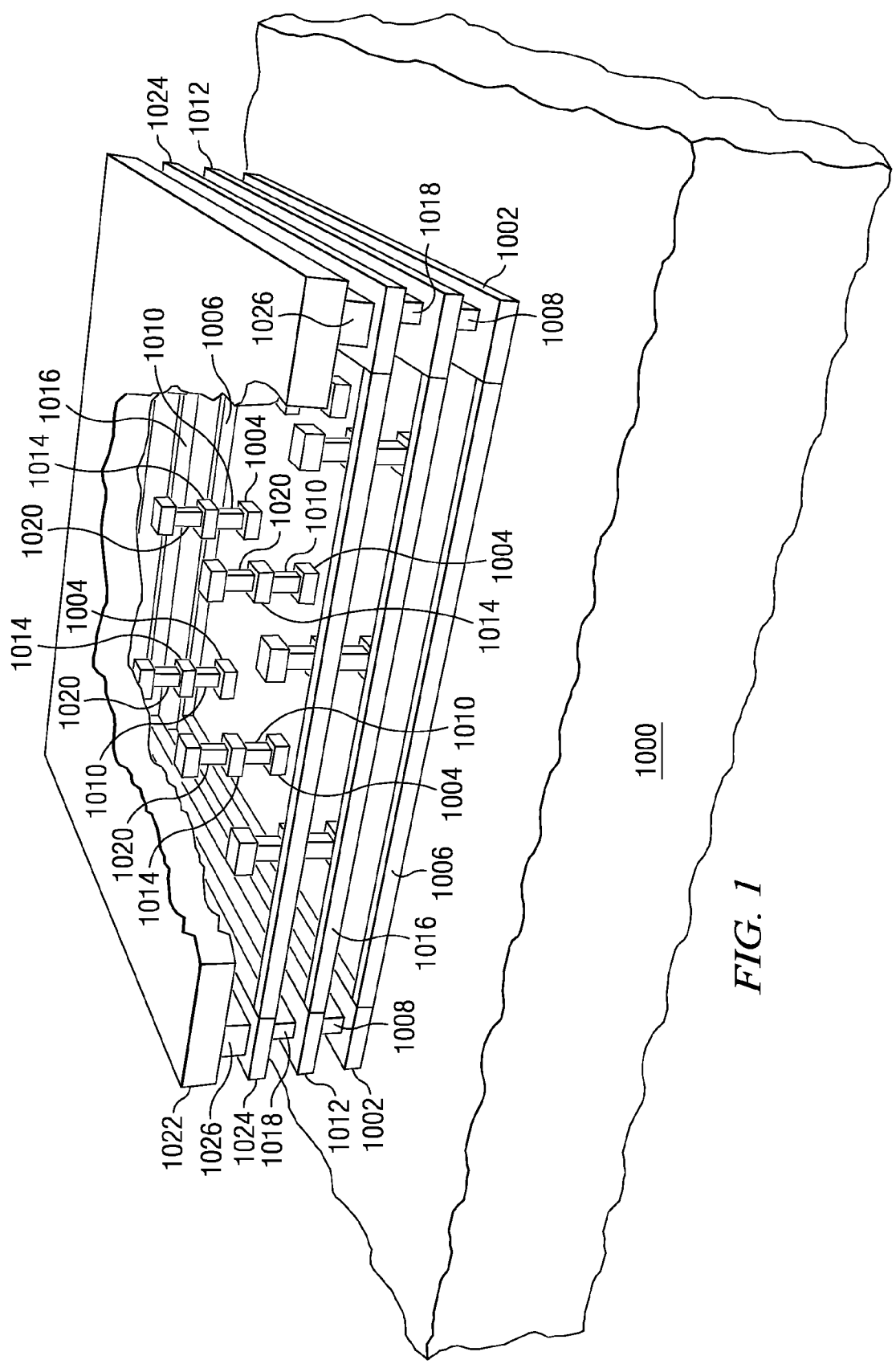
FIG. 1 is a perspective view of a probe pad formed according to one embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Integrated circuits are often fabricated on substrates, such as semiconductor wafers. Dicing operations, such as sawing or laser scribing, may be performed on the substrates to separate the integrated circuits from other regions of the substrates. For the purposes of this disclosure, the term "dicing kerf lane" is understood to mean a strip of a substrate designated for dicing, so that the substrate may be separated into two parts through the dicing kerf lane during a dicing operation. Substrate material removed by the dicing operation is substantially confined to the dicing kerf lane. Edges of the dicing kerf lane correspond substantially to edges of a dicing kerf resulting from the dicing operation. The term "micron" is understood to refer to "micrometer," which is a length equal to one-millionth of a meter.

An electrical probe pad structure may be formed across a dicing kerf lane on an integrated circuit substrate, possibly with multiple interconnect levels, such that a metal density of the probe pad in the dicing kerf lane is less than 70 percent, and such that the probe pad includes metal crack arresting strips adjacent to, and outside of, the dicing kerf lane. The crack arresting strips may be formed concurrently with metal interconnect lines in integrated circuits on the substrate. In an embodiment, transverse metal shunts may be formed which electrically connect crack arresting strips on opposite sides of the dicing kerf lane. In an embodiment, crack arresting trenched vias may be formed on either side of the electrical probe pad structure which connects crack arresting strips on sequential interconnect levels. The crack arresting trenched vias may be formed concurrently with metal vias in integrated circuits on the substrate. In an embodiment, fill vias may be formed to connect metal fill structures in the dicing kerf lane on sequential interconnect levels. In an embodiment, a probe pad on a top interconnect level may connect through parallel trenched vias to crack arresting strips on a lower interconnect level.

FIG. 1 is a perspective view of a probe pad formed according to one embodiment. A substrate (1000) may include a lower semiconductor layer and any subsequently formed layers such as dielectric layers on a top surface of the semiconductor layer. In the instant embodiment, a top surface of the substrate (1000) may contain exposed top surfaces of metal interconnect elements. A pair of first level crack arresting strips (1002) is formed of metal as part of a first metal interconnect level on a top surface of the substrate (1000). A dielectric layer in the first metal interconnect level is not shown in FIG. 1. In the instant embodiment, to a dicing kerf lane, not shown, runs between, and substantially parallel to, the first level crack arresting strips (1002). A metal density in the first metal interconnect level between the first level crack arresting strips (1002) is less than 70 percent. First level metal fill structures (1004) in the first metal interconnect level may be formed between the first level crack arresting strips (1002). In the instant embodiment, the first level metal fill structures (1004) do not contact the first level crack arresting strips (1002). In one embodiment, a density of first level metal fill structures (1004) is between 20 and 50 percent. First level transverse metal shunts (1006) in the first metal interconnect level may be formed to electrically connect the first level crack arresting strips (1002).

In one embodiment, the first level crack arresting strips (1002), first level metal fill structures (1004), if present, and the first level transverse metal shunts (1006), if present, may include copper formed by a damascene process. In one embodiment, the first level crack arresting strips (1002) may be less than one micron thick. In an alternate embodiment, the first level crack arresting strips (1002) may be between 1 micron and 5 microns thick. The first level crack arresting strips (1002), first level metal fill structures (1004), if present, and the first level transverse metal shunts (1006), if present, may be formed concurrently with metal interconnect lines in integrated circuits on the substrate (1000).

First level trench crack arresting trenched vias (1008) may be formed of metal in a first metal via level on top surfaces of the first level crack arresting strips (1002). First level fill vias (1010) may be formed of metal in the first metal via level on top surfaces of the first level metal fill structures (1004). A dielectric layer in the first metal via level is not shown in FIG. 1. The first level trench crack arresting trenched vias (1008) and first level fill vias (1010) may be formed concurrently with metal vias in integrated circuits on the substrate (1000).

If a second metal interconnect level is formed over the substrate (1000), a pair of second level crack arresting strips (1012) is formed of metal as part of the second metal interconnect level over the first level crack arresting strips (1002). A dielectric layer in the second metal interconnect level is not shown in FIG. 1. In the instant embodiment, the second level crack arresting strips (1012) are outside the dicing kerf lane. The second level crack arresting strips (1012) contact top surfaces of the first level crack arresting trenched vias (1008), if present.

A metal density in the second metal interconnect level between the second level crack arresting strips (1022) is less than 70 percent. If the second metal interconnect level is formed, second level metal fill structures (1014) in the second metal interconnect level may be formed between the second level crack arresting strips (1012), possibly contacting top surfaces of the first level fill vias (1010), if present. In the instant embodiment, the second level metal fill structures (1014) do not contact the second level crack arresting strips (1012). In one embodiment, a density of second level metal fill structures (1014) is between 20 and 50 percent. Second level transverse metal shunts (1016) in the second metal interconnect level, if present, may be formed to electrically connect the second level crack arresting strips (1012), if present.

If a second metal via level is formed, second level crack arresting trenched vias (1018) may be formed of metal in the second metal via level on top surfaces of the second level crack arresting strips (1012). Second level fill vias (1020) may be formed of metal in the second metal via level on top surfaces of the second level metal fill structures (1014). A dielectric layer in the second metal via level is not shown in FIG. 1.

If additional metal interconnect levels are formed over the substrate, additional crack arresting strips, similar to the first level crack arresting strips (1002) and the second level crack arresting strips (1012), are formed of metal in each metal interconnect level adjacent to, and outside of, the dicing kerf lane. A metal density in each metal interconnect level between the crack arresting strips is less than 70 percent. In one embodiment, a density of additional level metal fill structures at each additional metal interconnect level is between 20 and 50 percent. Additional metal fill structures may be formed between the crack arresting strips in the metal interconnect levels, similar to the first level metal fill structures (1004) and the second level metal fill structures (1014). Additional transverse metal shunts may be formed in the metal interconnect levels so as to electrically connect the additional crack arresting strips on opposite sides of the dicing kerf lane. In one embodiment, the additional crack arresting strips, if present, additional metal fill structures, if present, and additional transverse metal shunts, if present, may include copper formed by a single damascene process or a dual damascene process. In one embodiment, the additional crack arresting strips may be between 1 micron and 5 microns thick.

If additional metal via levels are formed over the substrate, additional crack arresting trenched vias, similar to the first level crack arresting trenched vias (1008) and the second level crack arresting trenched vias (1018), may be formed on top surfaces of the additional crack arresting strips. Additional fill vias, similar to the first level fill vias (1010) and the second level fill vias (1020), may be formed on top surfaces of the corresponding additional metal fill structures.

A probe contact pad (1022) may be formed over the dicing kerf lane and electrically connect to crack arresting strips (1024) in a top metal interconnect level through probe pad trenched vias (1026). The probe contact pad (1022) may be formed, for example, in a bondpad metallization level containing aluminum. The probe pad trenched vias (1026) may be formed in, for example, an upper dielectric layer.

Figure 2:
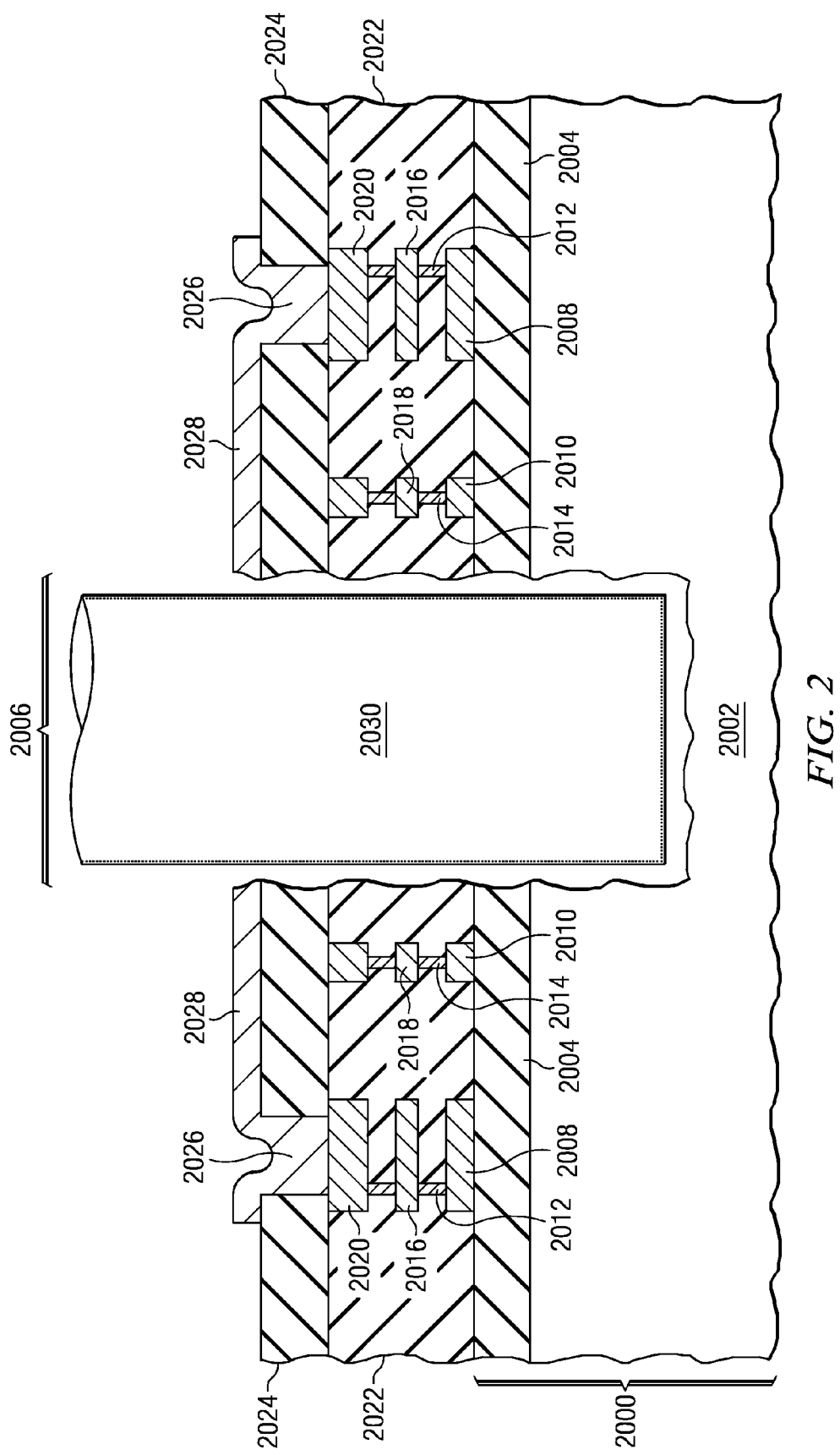
FIG. 2 depicts an electrical probe pad structure formed according to an embodiment during a saw dicing operation.

FIG. 2 depicts an electrical probe pad structure formed according to an embodiment during a saw dicing operation. A substrate (2000) includes a lower semiconductor layer (2002) and a dielectric layer (2004) formed on a top surface of the lower semiconductor layer (2002). The dielectric layer (2004) may include more than one dielectric sublayer. In other embodiments, the substrate (2000) may have a different structure. A dicing kerf lane (2006) runs perpendicular to a plane of FIG. 2. First level crack arresting strips (2008) are formed of metal on a top surface of the dielectric layer (2004) on both sides of the dicing kerf lane (2006). First level metal fill structures (2010) may be formed on a top surface of the dielectric layer (2004) in the electrical probe pad structure between the first level crack arresting strips (2008). Transverse metal shunts, if formed, are out of the plane of FIG. 2, and are not shown in FIG. 2.

First level crack arresting trenched vias (2012) may be formed on top surface of the first level crack arresting strips (2008). First level fill vias (2014) may be formed on top surfaces of the first level metal fill structures (2010).

Second level crack arresting strips (2016) may be formed over the first level crack arresting strips (2008), contacting the first level crack arresting trenched vias (2012), if present. Second level metal fill structures (2018) may be formed in the electrical probe pad structure between the second level crack arresting strips (2016), if present, contacting the first level fill vias (2014), if present.

Additional crack arresting strips, metal fill structures, crack arresting trenched vias and fill vias may be formed in the electrical probe pad structure, as described in reference to FIG. 1, culminating in topmost crack arresting strips (2020). Depending on a total number of interconnect levels formed the integrated circuit, the topmost crack arresting strips (2020) may be in a $3^{rd}$ interconnect level, a $4^{th}$ interconnect level, a $5^{th}$ interconnect level, and so on. In some embodiments, the topmost crack arresting strips (2020) may be the second level crack arresting strips (2016). In some embodiments, the topmost crack arresting strips (2020) may be the first level crack arresting strips (2008). Dielectric material (2022), including dielectric sublayers, is formed over the substrate (2000) during formation of metal interconnect lines and vias.

An upper dielectric layer (2024) may be formed on top surfaces of the top level crack arresting strips (2020). Probe pad trenched vias (2026) may be formed of metal in the upper dielectric layer (2024), electrically contacting the top surfaces of the top level crack arresting strips (2020). A probe contact pad (2028) may be formed in the electrical probe pad structure on a top surface of the upper dielectric layer (2024), electrically contacting top surfaces of the probe pad trenched vias (2026). The probe contact pad (2028) may be formed of a bondpad metallization layer, for example an aluminum containing metallization layer.

A saw blade (2030) cuts through the electrical probe pad structure between the crack arresting strips (2008, 2016, 2020) and into the substrate (2000) in the dicing kerf lane (2006) during a saw dicing operation. In some embodiments, the saw blade (2030) cuts completely through the substrate (2000).

Figure 3:
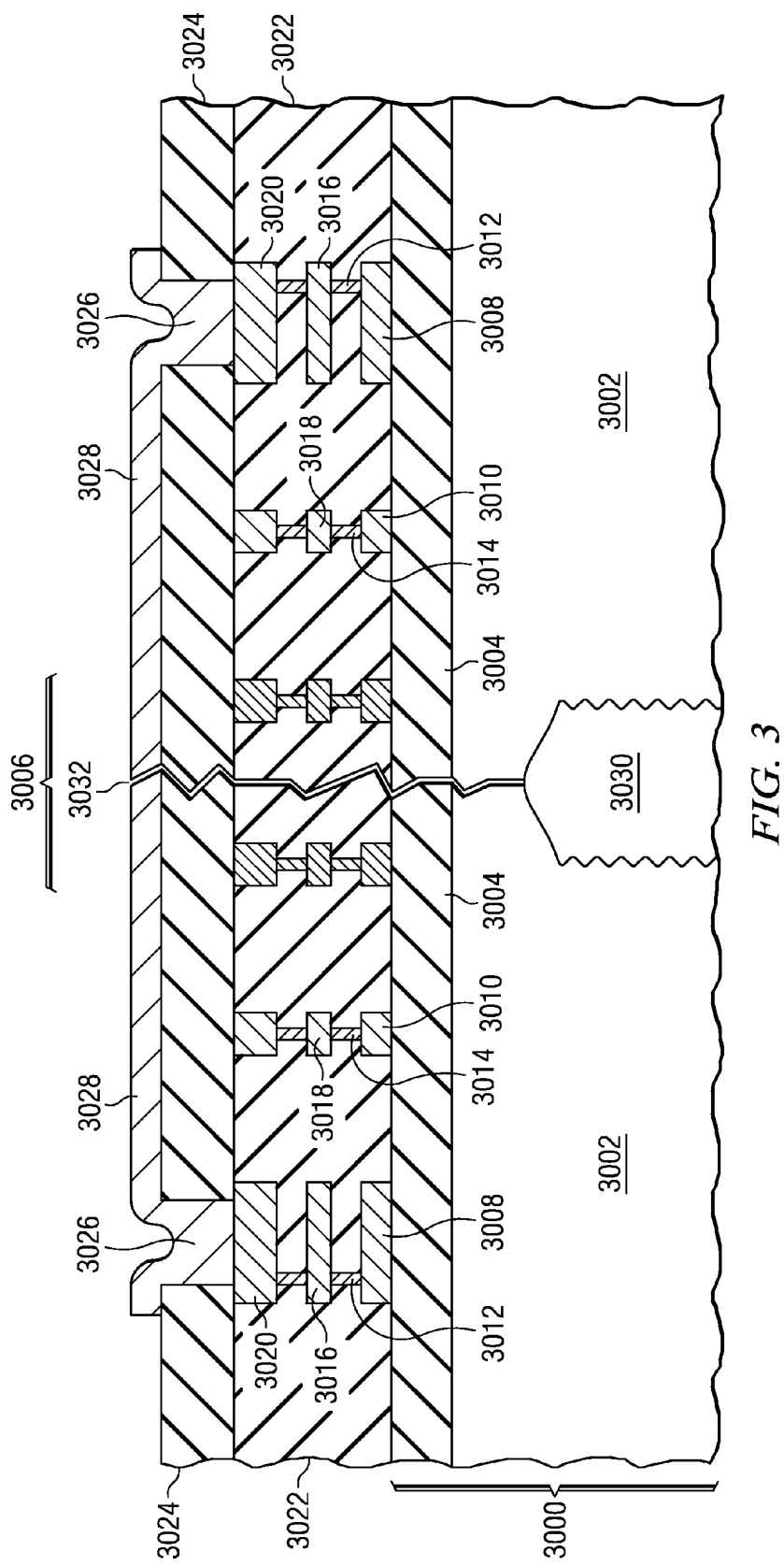
FIG. 3 depicts an electrical probe pad structure formed according to an embodiment during a laser scribe dicing operation.

FIG. 3 depicts an electrical probe pad structure formed according to an embodiment during a laser scribe dicing operation. A substrate (3000) includes a lower semiconductor layer (3002) and a dielectric layer (3004) as described in reference to FIG. 2. A dicing kerf lane (3006) runs perpendicular to a plane of FIG. 3. First level crack arresting strips (3008) and optional first level metal fill structures (3010) are formed on a top surface of the dielectric layer (3004) as described in reference to FIG. 2. Optional first level crack arresting trenched vias (3012) and optional first level fill vias (3014) may be formed as described in reference to FIG. 2.

Second level crack arresting strips (3016) and optional second level metal fill structures (3018) may be formed as described in reference to FIG. 2. Additional crack arresting strips, metal fill structures, crack arresting trenched vias and fill vias may be formed in the electrical probe pad structure, as described in reference to FIG. 2, culminating in topmost crack arresting strips (3020). Depending on a total number of interconnect levels formed the integrated circuit, the topmost crack arresting strips (3020) may be in a $3^{rd}$ interconnect level, a $4^{th}$ interconnect level, a $5^{th}$ interconnect level, and so on. In some embodiments, the topmost crack arresting strips (3020) may be the second level crack arresting strips (3016). In some embodiments, the topmost crack arresting strips (3020) may be the first level crack arresting strips (3008). Dielectric material (3022), including dielectric sublayers, is formed over the substrate (3000) during formation of metal interconnect lines and vias. An upper dielectric layer (3024), probe pad trenched vias (3026) and a probe contact pad (3028) may be formed in the electrical probe pad structure as described in reference to FIG. 2.

The laser scribe dicing operation generates a laser damaged region (3030) in the substrate (3000) in the dicing kerf lane (3006). A scribe crack (3032) is subsequently generated over the laser damaged region (3030) in the dicing kerf lane (3006).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit substrate containing a dicing kerf lane, said integrated circuit substrate comprising:
   an electrical probe pad structure formed on said substrate, said electrical probe pad structure further including:
      a first crack arresting strip formed of metal in a first metal interconnect level, said first crack arresting strip being located adjacent to, and outside of, said dicing kerf lane; and
      a second crack arresting strip formed of metal in said first metal interconnect level, said second crack arresting strip being located adjacent to, and outside of, said dicing kerf lane, on an opposite side of said dicing kerf lane from said first crack arresting strip;
      such that a metal density in said first metal interconnect level between said first crack arresting strip and said second crack arresting strip is less than 70 percent.

2. The integrated circuit substrate of claim 1, said electrical probe pad structure further including a transverse metal shunt formed of metal in said first metal interconnect level, said transverse metal shunt electrically connecting said first crack arresting strip to said second crack arresting strip.

3. The integrated circuit substrate of claim 1, said electrical probe pad structure further including:
   a first crack arresting trenched via formed of metal in a first metal via level, said first crack arresting trenched via formed on a top surface of said first crack arresting strip;
   a second crack arresting trenched via formed of metal in said first metal via level, said second crack arresting trenched via formed on a top surface of said second crack arresting strip;
   a third crack arresting strip formed of metal in a second metal interconnect level, said third crack arresting strip contacting said first crack arresting trenched via, and said third crack arresting strip being located adjacent to, and outside of, said dicing kerf lane; and
   a fourth crack arresting strip formed of metal in said second metal interconnect level, said fourth crack arresting strip contacting said second crack arresting trenched via, and said fourth crack arresting strip being located adjacent to, and outside of, said dicing kerf lane.

4. The integrated circuit substrate of claim 1, said electrical probe pad structure further comprising a plurality of metal fill structures formed in said first metal interconnect level between said first crack arresting strip and said second crack arresting strip.

5. The integrated circuit substrate of claim 1, said electrical probe pad structure further including:
   an upper dielectric layer formed on top surfaces of topmost crack arresting strips;
   probe pad trenched vias formed of metal in said upper dielectric layer, such that said probe pad trenched vias electrically contact top surfaces of said topmost crack arresting strips; and
   a probe contact pad formed on a top surface of said upper dielectric layer, such that said probe contact pad electrically contacts top surfaces of said probe pad trenched vias.

6. The integrated circuit substrate of claim 1, in which said first crack arresting strip and said second crack arresting strip include copper and are greater than one micron thick.

7. The integrated circuit substrate of claim 1, in which metal density in said first metal interconnect level between said first crack arresting strip and said second crack arresting strip is between 20 and 50 percent.

8. An electrical probe pad structure on an integrated circuit substrate, said electrical probe pad structure comprising:
   a first crack arresting strip formed of metal in a first metal interconnect level, said first crack arresting strip being located along a first side of said electrical probe pad structure;
   a second crack arresting strip formed of metal in said first metal interconnect level, said second crack arresting strip being along an opposite side of said electrical probe pad structure from said first crack arresting strip;

a transverse metal shunt formed of metal in said first metal interconnect level, said transverse metal shunt electrically connecting said first crack arresting strip to said second crack arresting strip; and a plurality of metal fill structures formed in said first metal interconnect level between said first crack arresting strip and said second crack arresting strip, such that a metal density in said first metal interconnect level between said first crack arresting strip and said second crack arresting strip is less than 70 percent.

9. The electrical probe pad structure of claim 8, further including:

a first crack arresting trenched via formed of metal in a first metal via level, said first crack arresting trenched via formed on a top surface of said first crack arresting strip;

a second crack arresting trenched via formed of metal in said first metal via level, said second crack arresting trenched via formed on a top surface of said second crack arresting strip;

a third crack arresting strip formed of metal in a second metal interconnect level, said third crack arresting strip contacting said first crack arresting trenched via, and said third crack arresting strip being located adjacent to, and outside of, said dicing kerf lane; and a fourth crack arresting strip formed of metal in said second metal interconnect level, said fourth crack arresting strip contacting said second crack arresting trenched via, and said fourth crack arresting strip being located adjacent to, and outside of, said dicing kerf lane.

10. The electrical probe pad structure of claim 8, further including:

an upper dielectric layer formed on top surfaces of topmost crack arresting strips;

probe pad trenched vias formed of metal in said upper dielectric layer, such that said probe pad trenched vias electrically contact top surfaces of said topmost crack arresting strips; and a probe contact pad formed on a top surface of said upper dielectric layer, such that said probe contact pad electrically contacts top surfaces of said probe pad trenched vias.

11. The electrical probe pad structure of claim 8, in which said first crack arresting strip and said second crack arresting strip include copper and are greater than one micron thick.

12. The electrical probe pad structure of claim 8, in which said metal density in said first metal interconnect level between said first crack arresting strip and said second crack arresting strip is between 20 and 50 percent.

* * * * *